United States Patent
Liu et al.

(10) Patent No.: US 6,943,077 B2
(45) Date of Patent: Sep. 13, 2005

(54) SELECTIVE SPACER LAYER DEPOSITION METHOD FOR FORMING SPACERS WITH DIFFERENT WIDTHS

(75) Inventors: Ai-Sen Liu, Hsinchu (TW); Baw-Ching Perng, Hsin-Chu (TW); Ming-Ta Lei, Hsin-Chu (TW); Yih-Shung Lin, San Chung (TW); Cheng-Chung Lin, Taipei (TW); Chia-Hui Lin, Hsin-Chu (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

(21) Appl. No.: 10/408,689

(22) Filed: Apr. 7, 2003

(65) Prior Publication Data

US 2004/0198060 A1 Oct. 7, 2004

(51) Int. Cl.[7] .......................................... H01L 21/8238
(52) U.S. Cl. ...................... 438/230; 438/303; 438/366; 438/595
(58) Field of Search ................................ 438/184, 230, 438/303, 366, 696, 704, 706, 709, 798, 595, 229, 231; 257/E21.626, E21.64, 900

(56) References Cited

U.S. PATENT DOCUMENTS

| | | | | |
|---|---|---|---|---|
| 5,460,998 A | * | 10/1995 | Liu | 438/231 |
| 5,656,518 A | * | 8/1997 | Gardner et al. | 438/286 |
| 5,783,475 A | | 7/1998 | Ramaswami | 438/303 |
| 5,849,616 A | * | 12/1998 | Ogoh | 438/231 |
| 5,965,464 A | * | 10/1999 | Tsai et al. | 438/723 |
| 6,074,908 A | * | 6/2000 | Huang | 438/241 |
| 6,150,223 A | * | 11/2000 | Chern et al. | 438/303 |
| 6,174,756 B1 | * | 1/2001 | Gambino et al. | 438/163 |
| 6,194,258 B1 | * | 2/2001 | Wuu | 438/200 |
| 6,248,623 B1 | * | 6/2001 | Chien et al. | 438/241 |
| 6,261,891 B1 | * | 7/2001 | Cheng et al. | 438/238 |
| 6,297,535 B1 | * | 10/2001 | Gardner et al. | 257/344 |
| 6,316,304 B1 | * | 11/2001 | Pradeep et al. | 438/230 |
| 6,323,519 B1 | * | 11/2001 | Gardner et al. | 257/336 |
| 6,344,398 B1 | * | 2/2002 | Hsu | 438/303 |
| 6,350,696 B1 | | 2/2002 | Shields et al. | 438/704 |
| 6,352,940 B1 | * | 3/2002 | Seshan et al. | 438/762 |
| 6,395,596 B1 | * | 5/2002 | Chien et al. | 438/241 |
| 6,403,487 B1 | * | 6/2002 | Huang et al. | 438/706 |
| 6,440,875 B1 | | 8/2002 | Chan et al. | 438/778 |
| 6,455,389 B1 | * | 9/2002 | Huang et al. | 438/305 |
| 6,495,889 B1 | * | 12/2002 | Takahashi | 257/382 |
| 6,506,642 B1 | * | 1/2003 | Luning et al. | 438/231 |
| 6,534,388 B1 | * | 3/2003 | Lin et al. | 438/510 |
| 6,537,885 B1 | * | 3/2003 | Kang et al. | 438/303 |
| 6,541,823 B1 | * | 4/2003 | Yoshiyama et al. | 257/351 |
| 6,555,868 B2 | * | 4/2003 | Shimizu et al. | 257/315 |
| 6,596,576 B2 | * | 7/2003 | Fu et al. | 438/230 |
| 6,713,392 B1 | * | 3/2004 | Ngo et al. | 438/682 |
| 6,730,556 B2 | * | 5/2004 | Wu et al. | 438/230 |
| 2002/0045357 A1 | * | 4/2002 | Furukawa et al. | 438/758 |

* cited by examiner

*Primary Examiner*—Long Phan
*Assistant Examiner*—Thao X. Le
(74) *Attorney, Agent, or Firm*—Duane Morris LLP

(57) ABSTRACT

A method of forming spacers with different widths on a semiconductor substrate, includes the steps of disposing a first spacer layer over the substrate, defining the first spacer layer into a plurality of spacers of a first width, and disposing a second spacer layer selectively over the first spacer layer of a number of the spacers preselected for the second spacer layer, the predetermined number of the spacers with the second spacer layer each having a second width which is different from the first width.

21 Claims, 3 Drawing Sheets

SELECTIVE SPACER LAYER DEPOSITION METHOD FOR FORMING SPACERS WITH DIFFERENT WIDTHS

FIELD OF THE INVENTION

The present invention relates to a method of fabricating a semiconductor device, and more particularly, to a method of forming spacers with different widths on a semiconductor substrate.

BACKGROUND OF THE INVENTION

Fabricating integrated circuits with faster and/or an increasing number of semiconductor devices is a continuing trend in integrated circuit technology. A very influential factor in this trend is technology scaling, i.e., the reduction in transistor feature sizes. Technology scaling has enabled transistors to become smaller, thus allowing for more dense integrated circuits in terms of the number of transistors packed on a chip.

At virtually the same time that transistors are becoming smaller, chip sizes have been increasing in size. The chip size increase has, in turn, resulted in transistor driving capability decreases and interconnect parasitics increases. Accordingly, integrated circuits, such as, embedded memory circuits, mixed-mode/RF signal circuits, and System on a Chip (SOC) circuits, must be very carefully designed to meet future speed demands. Design issues which are very critical in the development of such circuits include, for example, transistor architecture. Specifically, careful gate design, transistor sizing, and other such feature parameters are extremely important in order to optimize transistor performance.

Spacers are commonly used in the fabrication of semiconductor devices and integrated circuits. The spacers may be used, for example, to control transistor gate size, source and drain regions placement or other features. Because variously sized transistors and other features are often required in a particular integrated circuit design, spacers of different widths must be utilized during the fabrication thereof.

Spacers of different widths are typically formed using conventional etching methods. These etching methods, unfortunately, may damage the thin, dielectric gate insulating layer and substrate. Accordingly, a new method is needed for forming spacers of varying width.

SUMMARY OF THE INVENTION

A method is disclosed herein for forming spacers with different widths on a semiconductor substrate. The method comprises the steps of disposing a first spacer layer over the substrate, defining the first spacer layer into a plurality of spacers of a first width, and disposing a second spacer layer selectively over the first spacer layer of a number of the spacers preselected for the second spacer layer, the predetermined number of the spacers with the second spacer layer each having a second width which is different from the first width.

DETAILED DESCRIPTION

FIGS. 1–7 illustrate a method for forming two or more spacers with different widths on a semiconductor device according to the present invention.

Figure 1:
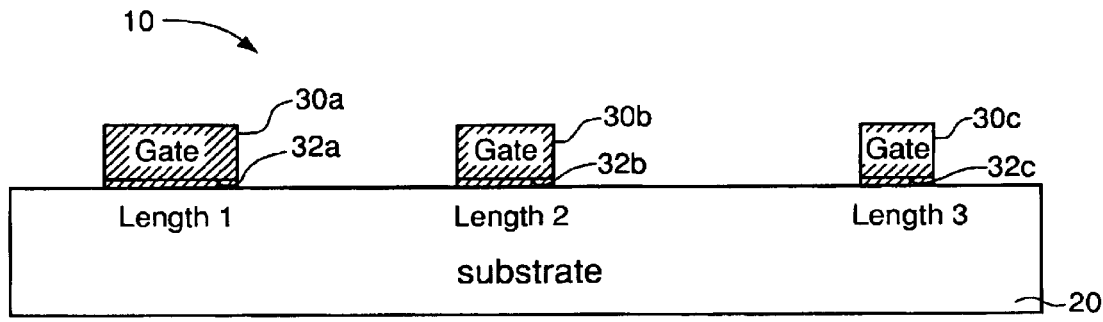
FIGS. 1–7 are cross sectional views illustrating a method for forming spacers with different widths on a semiconductor device according to the present invention.

Referring to FIG. 1, there is illustrated a cross-section of a portion of a semiconductor device 10. The semiconductor device 10 includes a substrate 20 that may be comprised of a semiconductor material, such as single crystal silicon or gallium arsenide. A plurality of features with different line widths are disposed over the substrate 20 and may include, for purposes of illustrating the method of the invention and not limitation, a first gate electrode 30a of a first length, a second gate electrode 30b of a second length, and a third gate electrode 30c of a third length are disposed over the substrate 20. The different gate lengths used in this embodiment of the invention may be provided, for example, to optimize the transistor performance of an embedded DRAM semiconductor device 10. The gate electrodes 30a–30c are electrically insulated from the substrate 20 by thin, dielectric gate insulating layers 32a–32c.

The gate electrodes 30a–30c may be formed from a polysilicon, such as undoped poly, amorphous poly, doped poly, and the like, using conventional forming methods, such as physical vapor deposition (PVD) or chemical vapor deposition (CVD). The thin, dielectric gate insulating layers 32a–32c, may be formed on the substrate 20 from an oxide layer using conventional forming methods, such as physical or chemical vapor deposition, prior to the formation of the gate electrodes 30a–30c. In another embodiment, the thin, dielectric gate insulating layers may be formed from a nitride layer.

Figure 2:
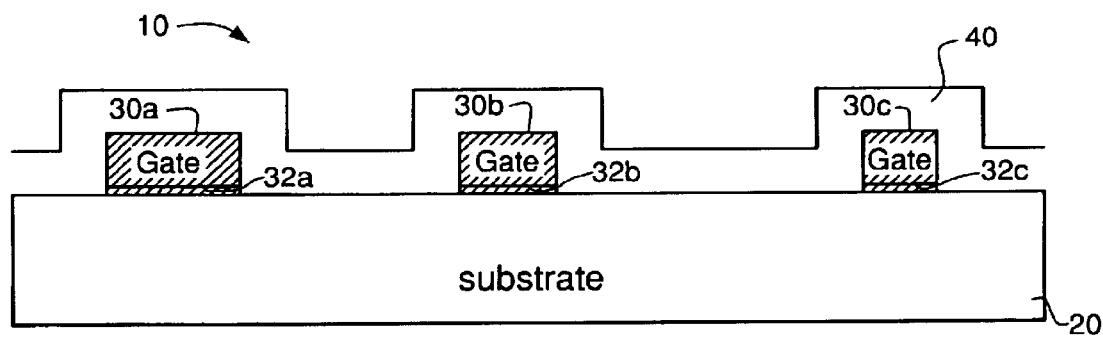

Referring to FIG. 2, a first dielectric insulating spacer layer 40 is formed over the substrate 10 and gate electrodes 30a–30c using conventional forming methods, such as PVD or CVD. The first spacer layer 40 may be formed from a nitride such as silicon nitride SiN, or an oxide such as silicon oxide $SiO_2$. The first spacer layer 40 may be deposited to a thickness ranging from approximately 500 Å to 1000 Å.

Figure 3:
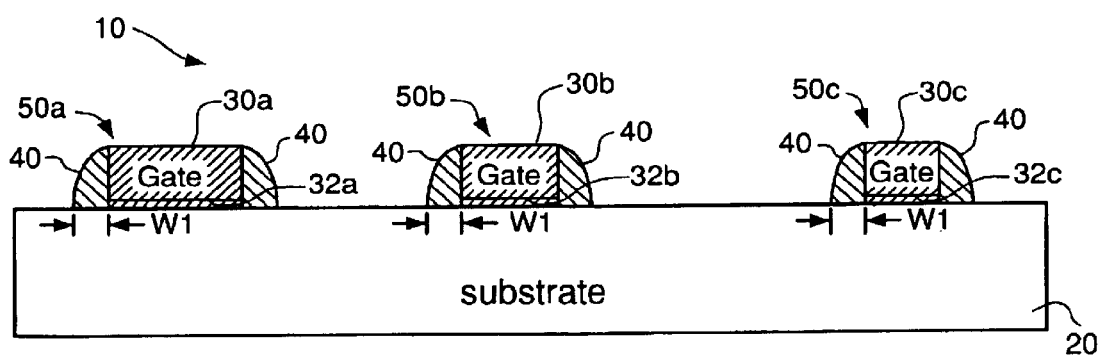

Referring to FIG. 3, a first patterned photoresist layer or mask layer (not shown) is provided over the first spacer layer 40, and the semiconductor device 10 is anisotropically etched to define the first spacer layer 40 into three spacers 50a–50c each having the same width W1, adjacent the side walls of the gate electrodes 30a–30c. The anisotropic etch may be performed using a conventional plasma reactive-ion etching method. After etching, the first mask layer is removed.

Figure 4:
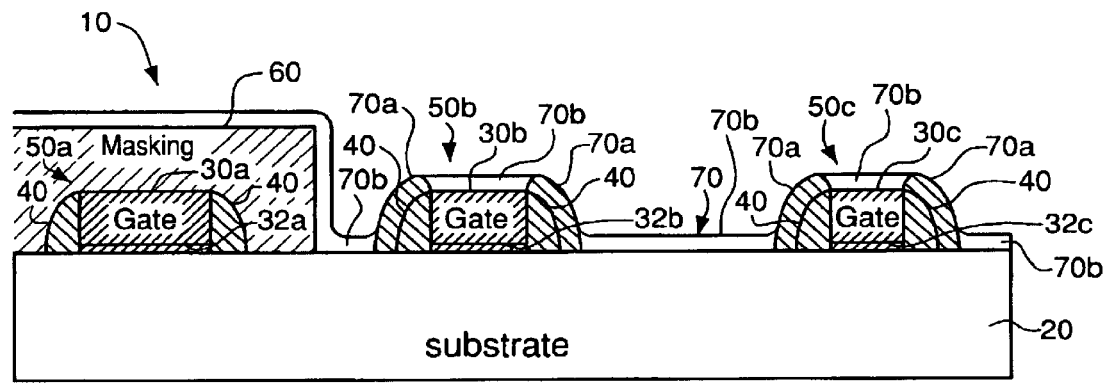

Referring to FIG. 4, spacers of other widths are formed in accordance with the present invention using selective deposition. For example, spacers having a width W2, which is greater than width W1, may be formed by providing a second mask layer 60 over the spacer 50a of the first width and adjacent gate electrode 30a, and then selectively depositing a second spacer layer 70 over the first spacer layer 40 of the two unmasked spacers 50b and 50c. The selective deposition may be accomplished by treating the substrate 20 with a plasma to generate dangling bonds on the surface of the first spacer layer 40 of the two unmasked spacers 50b and 50c. The dangling bonds alter the chemical properties of the surface, e.g. the bonding properties, solvent resistivity properties, and the like. The plasma treatment does not generate dangling bonds on the unmasked gate electrodes 30b and 30c and the substrate 20 because these features are made from different materials than the first spacer layer 40. After the plasma treatment, the second spacer layer 70 may be formed over the substrate using PVD or CVD. The portions 70a of the second spacer layer 70 overlying the first spacer layers 40 of the unmasked spacers 50b and 50c firmly bond thereto via the dangling bonds at the interface of the first spacer layer 40 and the directly overlying portions 70a of the second spacer layer 70. However, the portions 70b of the second spacer layer 70 directly overlying the untreated features are easily removed using for example, a wet bench, due to the lack of dangling bonds at the interface thereof. After enlarging the spacers 50b and 50c, the second mask layer 60 may then be removed.

Figure 5:
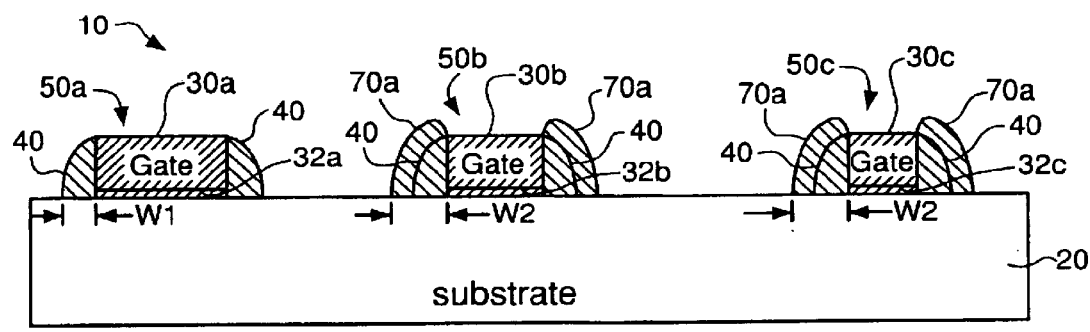

FIG. 5 illustrates the device 10 after removal of the weakly bonded portions of the second spacer layer 70. As illustrated, the selective deposition process enlarges the spacers 50b and 50c to a width W2.

Figure 6:
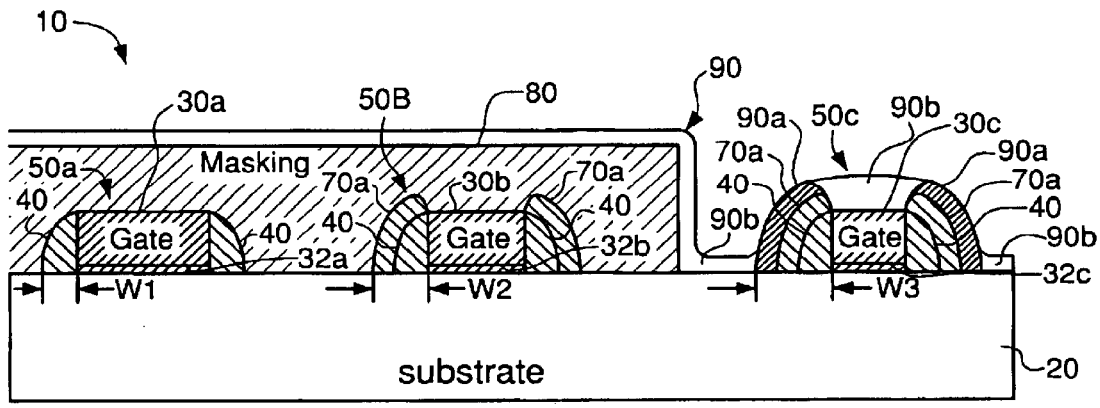
Figure 7:
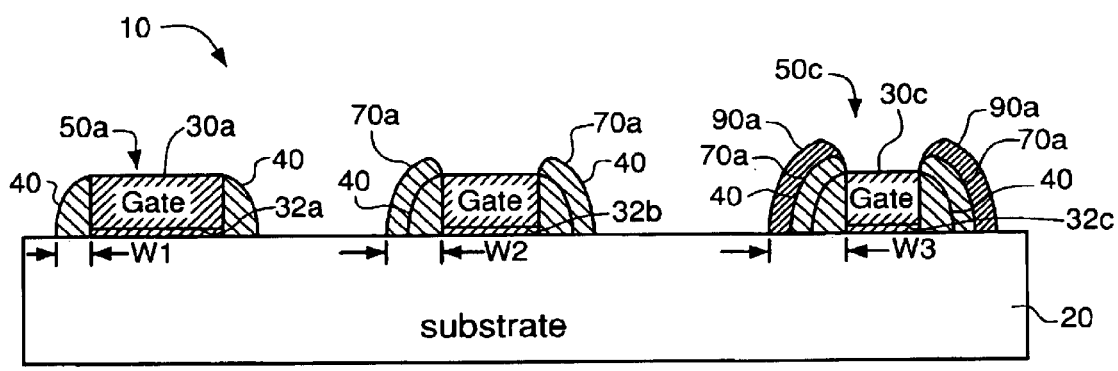

If spacers having a width W3, which is greater than width W2, are desired, a third mask layer 80 may be provided over the spacer 50a of width W1 and its adjacent gate electrode 30a and spacer 50b of width W2 and its adjacent gate electrode 30b as illustrated in FIG. 6. A third spacer layer 90 is then selectively deposited over the second spacer layer portions 70a of the unmasked spacer 50c using the selective deposition process described above, i.e., treating the substrate with a plasma to generate dangling bonds on the surface of the second spacer layer portions 70a of the unmasked spacer 50c; forming the third spacer layer 90 over the substrate using PVD or CVD; removing the weakly bonded portions 90b of the third spacer layer 90 using a wet bench, and removing the third mask layer 80, thereby leaving the spacer 50c enlarged by the firmly bonded third spacer layer portions 90a to a width of W3 as illustrated in FIG. 7.

The plasma treatment may be performed using conventional CVD processing equipment. The plasma used in this process may comprise an $NH_3$ or $N_2O$ plasma, depending upon the composition of the spacer layer to be treated. For example, in one embodiment of the invention where the first spacer layer is composed of $SiO_2$, an $NH_3$ plasma may be used to generate Si—N dangling bonds over the surface of the $SiO_2$ first spacer layer. The second spacer layer will then be formed by depositing $SiO_2$ over the plasma treated first spacer layer. The $SiO_2$ deposition produces an oxygen-rich, silicon oxynitride (SiON) film over the first spacer layer due to the Si—N dangling bonds, the oxygen-rich SiON film forming the second spacer layer. The unwanted portions of the second spacer layer formed over the other features of the device, such as the gate electrodes (made of poly-silicon for example) and the substrate (made of silicon for example), will still be composed of $SiO_2$ because these features do not have dangling bonds. These unwanted $SiO_2$ portions of the second spacer layer are easily removed by solvent selectivity due to the different materials.

If a third spacer layer is desired, the oxygen-rich SiON film forming the second spacer layer may be treated with an $N_2O$ plasma to generate Si—O dangling bonds over the surface of the second spacer layer. Next, the third spacer layer will be formed by depositing SiN over the second spacer layer. The SiN deposition produces a nitrogen-rich, SiON film over the second spacer layer, the nitrogen-rich SiON film forming the third spacer layer. The unwanted portions of the third spacer layer formed over the other features of the device are still composed of SiN. These unwanted portions of the third spacer layer are easily removed by solvent selectivity due to the different materials.

In a second embodiment of the invention where the first spacer layer is composed of SiN, an $N_2O$ plasma may be used to generate Si—O dangling bonds over the surface of the SiN first spacer layer. The second spacer layer will then be formed by depositing SiN over the plasma treated first spacer layer. The SiN deposition produces an nitrogen-rich, silicon oxynitride (SiON) film over the first spacer layer due to the Si—O dangling bonds, the nitrogen-rich SiON film forming the second spacer layer. The unwanted portions of the second spacer layer formed over the other features of the device, such as the gate electrodes and the substrate, will still be composed of SiN because these features do not have dangling bonds. These unwanted SiN portions of the second spacer layer are easily removed by solvent selectivity due to the different materials.

If a third spacer layer is desired, the nitrogen-rich SiON film forming the second spacer layer is treated with an $NH_3$ plasma to generate Si—N dangling bonds over the surface of the second spacer layer. Next, the third spacer layer will be formed by depositing $SiO_2$ over the second spacer layer. The $SiO_2$ deposition produces an oxygen-rich, SiON film over the second spacer layer, the oxygen-rich SiON film forming the third spacer layer. The unwanted portions of the third spacer layer formed over the other features of the device are still composed of $SiO_2$. These unwanted portions of the third spacer layer are easily removed by solvent selectivity due to the different materials.

Spacers of increasing widths may be formed by repeating the selective deposition process as many times as desired. The width of a spacer formed in accordance with the present invention is determined by the number of spacer layers used to form the spacer.

The present invention addresses and solves the problems associated with forming spacers of varying widths. Through selective deposition to form spacers of varying width, damage to the thin, dielectric gate insulating layer and substrate is avoided.

While the foregoing invention has been described with reference to the above embodiments, various modifications and changes can be made without departing from the spirit of the invention. Accordingly, all such modifications and changes are considered to be within the scope of the appended claims.

What is a claimed is:

1. A method of forming spacers with different widths on a semiconductor substrate, the method comprising the steps of:

disposing a first spacer layer over the substrate;

defining the first spacer layer into a first plurality of spacers each of a first width; and selectively disposing a second spacer layer on preselected ones of the first plurality spacers to form a second plurality of spacers, the second plurality of spacers each of a second width which is different from the first width;

wherein the step of selectively disposing a second spacer layer includes the steps of masking the spacers not preselected for the second spacer layer and forming dangling bonds on a surface of the first spacer layer of each of the preselected spacers.

2. The method according to claim 1, wherein the step of forming dangling bonds is performed by treating the surface of the first spacer layer with a plasma.

3. The method according to claim 2, wherein the plasma is one of an $NH_3$ plasma and an $N_2O$ plasma.

4. The method according to claim 1, wherein the first spacer layer comprises a dielectric material.

5. The method according to claim 4, wherein the dielectric material is one of $SiO_2$ and SiN.

6. The method according to claim 1, wherein the second spacer layer comprises a dielectric material.

7. The method according to claim 6, wherein the dielectric material is one of $SiO_2$ and SiN.

8. The method according to claim 1, further comprising the step of selectively disposing a third spacer layer over a number of the preselected spacers which have been preselected for the third spacer layer.

9. The method according to claim 8, wherein the step of selectively disposing a third spacer layer includes the steps of:
the masking the spacers not preselected for the third spacer layer; and
forming dangling bonds on a surface of the second spacer layer of each of the spacers preselected for the third spacer layer.

10. The method according to claim 9, wherein the step of forming dangling bonds is performed by treating the surface of the second spacer layer with a plasma.

11. The method according to claim 10, wherein the plasma is one of an $NH_3$ plasma and an $N_2O$ plasma.

12. The method according to claim 8, wherein the step of selectively disposing a third spacer layer includes the step of forming dangling bonds on a surface of the second spacer layer of each of the spacers preselected for the third spacer layer.

13. The method according to claim 12, wherein the step of forming dangling bonds is performed by treating the surface of the second spacer layer with a plasma.

14. The method according to claim 13, wherein the plasma is one of an $NH_3$ plasma and an $N_2O$ plasma.

15. The method according to claim 8, wherein the first spacer layer comprises a dielectric material.

16. The method according to claim 15, wherein the dielectric material is one of $SiO_2$ and SiN.

17. The method according to claim 8, wherein the second spacer layer comprises a dielectric material.

18. The method according to claim 17, wherein the dielectric material is one of $SiO_2$ and SiN.

19. The method according to claim 8, wherein the third spacer layer comprises a dielectric material.

20. The method according to claim 19, wherein the dielectric material is one of $SiO_2$ and SiN.

21. A method of forming spacers with different widths on a semiconductor substrate, the method comprising the steps of:
forming a first spacer layer over the substrate;
defining the first spacer layer into a plurality of spacers;
forming dangling bonds on less than all of the spacers; and
forming a second spacer layer over the substrate, the second spacer layer providing the spacers having the dangling bonds formed thereon with a width which is different from the spacers not having the dangling bonds formed thereon.

* * * * *